(12) United States Patent
Min et al.

(10) Patent No.: US 8,319,297 B2
(45) Date of Patent: Nov. 27, 2012

(54) MAGNETIC TUNNEL JUNCTION STRUCTURE WITH PERPENDICULAR MAGNETIZATION LAYERS

(75) Inventors: Byoung Chul Min, Seoul (KR); Gyung Min Choi, Seoul (KR); Kyung Ho Shin, Seoul (KR)

(73) Assignee: Korea Institute of Science and Technology (KR)

( * ) Notice: Subject to any disclaimer, the term of this patent is extended or adjusted under 35 U.S.C. 154(b) by 106 days.

(21) Appl. No.: 12/897,914

(22) Filed: Oct. 5, 2010

(65) Prior Publication Data
US 2011/0089508 A1     Apr. 21, 2011

(30) Foreign Application Priority Data

Oct. 19, 2009 (KR) .................. 10-2009-0099432

(51) Int. Cl.
    *H01L 29/82* (2006.01)
(52) U.S. Cl. ......... 257/421; 257/E21.665; 257/E29.323; 365/158; 365/171
(58) Field of Classification Search ...... 438/3; 257/295, 257/421, E21.665, E29.323; 365/158, 171, 365/173
See application file for complete search history.

(56) References Cited

U.S. PATENT DOCUMENTS

| | | | |
|---|---|---|---|
| 2002/0131214 A1* | 9/2002 | Covington et al. | 360/324 |
| 2007/0025029 A1* | 2/2007 | Hayakawa et al. | 360/324.2 |
| 2007/0096229 A1* | 5/2007 | Yoshikawa et al. | 257/421 |
| 2008/0231998 A1* | 9/2008 | Yoshikawa et al. | 360/313 |

FOREIGN PATENT DOCUMENTS

| | | |
|---|---|---|
| KR | 10-2006-0118013 | 11/2006 |
| KR | 10-2010-0047985 | 5/2010 |

OTHER PUBLICATIONS

Office Action issued by Korean Patent Office on Nov. 30, 2011 in connection with corresponding Korean application No. 10-2009-0099432, (Nov. 30, 2011).

* cited by examiner

*Primary Examiner* — Khiem D Nguyen
(74) *Attorney, Agent, or Firm* — Ostrolenk Faber LLP

(57) ABSTRACT

Disclosed is a magnetic tunnel junction structure having perpendicular anisotropic free layers, and it could be accomplished to reduce a critical current value required for switching and maintain thermal stability even if a device is fabricated small in size, by maintaining the magnetization directions of the free magnetic layer and the fixed magnetic layer constituting the magnetic tunnel junction structure perpendicular to each other.

18 Claims, 3 Drawing Sheets

MAGNETIC TUNNEL JUNCTION STRUCTURE WITH PERPENDICULAR MAGNETIZATION LAYERS

CROSS-REFERENCE TO RELATED APPLICATION

Pursuant to 35 U.S.C. §119(a), this application claims the benefit of earlier filing date and right of priority to Korean Application No. 10-2009-0099432, filed on Oct. 19, 2009, the contents of which is incorporated by reference herein in its entirety.

BACKGROUND OF THE INVENTION

1. Field of the Invention

The present invention relates to a magnetic tunnel junction structure with perpendicular magnetic anisotropy (PMA) free layers.

2. Background of the Invention

Magnetic random access memories (MRAMs) currently developed for practical applications utilizes a magnetic tunnel junction (MTJ) element that forms a ferromagnetic tunnel junction as a magneto-resistive device. The MTJ device includes tri-layer consisting of two magnetic layers separated by a non-magnetic layer, and current flows by tunneling through the non-magnetic layer (tunnel barrier). As another structure of MTJ device, a so-called spin-valve structure is known in which an antiferrormagnetic layer is assigned close to a magnetic layer at one side for the purpose of improving magnetic field sensitivity and a magnetization direction is fixed.

In case of a conventional MRAM, the magnetization of a ferromagnetic material constituting a unit cell is typically controlled by magnetic field. By contrast, it is possible to realize a current-induced magneto-resistive device in which the magnetization of a ferromagnetic material can be changed by applying a spin-polarized current. The current-induced magneto-resistive device is referred to as a device in which the magnetization direction can be controlled by applying a current to the magnetic layer thereof, differently from a typical magneto-resistive device in which the magnetization direction of a magnetic layer is controlled by applying a magnetic field.

The method of reading information in a current-induced magneto-resistive device is similar to the case of a conventional magnetic field-induced MTJ or a giant magneto-resistance (GMR) device. The device has a low resistance value if the magnetization orientation of a free magnetic layer and that of a fixed magnetic layer are in parallel configuration, and a high resistance value if they are in anti-parallel configuration, which correspond to digital information "0" and "1," respectively.

The major difference between a current-induced magneto-resistive device and a magnetic field-induced MTJ or GMR device lies in the method of recording information. In case where the magnetization direction of a fixed magnetic layer is opposite to that of a free magnetic layer and electrons are flowing from the fixed magnetic layer to the free magnetic layer, current spin-polarized by the fixed magnetic layer are injected into the free magnetic layer. In this case, an amount of spin angular momentum of electrons is transferred into the free magnetic layer, and if an amount of the angular momentum exceeds a threshold level, then the magnetization direction of the free magnetic layer is reversed in the direction parallel to that of the fixed magnetic layer. In contrast, in case where the magnetization direction of the fixed magnetic layer is the same as that of the free magnetic layer, and electrons are flowing from the free magnetic layer to the fixed magnetic layer, electrons having a spin of the same direction to that of the fixed magnetic layer are injected into and passed through the fixed magnetic layer, and some of electrons having a spin of the opposite direction to the fixed magnetic layer are reflected at the interface of the non-magnetic layer and fixed magnetic layer and returned to the free magnetic layer. Those electrons exerts a torque opposite to the spin direction of the free magnetic layer and reverses the magnetization direction of the free magnetic layer, thereby allowing the direction of the two magnetic layers to be anti-parallel.

In addition, the current-induced magneto-resistive device may also be applicable to a current oscillator at a frequency band of microwave applications by using the same principle.

Such a current-induced magneto-resistive device has a typical problem in that an amount of current required for reversing the magnetization direction is large. If the current is large, then it is difficult to fabricate a drive circuit for controlling a device. In general, one transistor is connected to each device to constitute a memory by using a current-induced magneto-resistive device. The amount of current is limited by the size of a transistor, and thus the size of a transistor should become larger to allow more current to flow therethrough.

Such a problem may cause an increase of the power consumption in driving a device and also gives rise to difficulties in the integration of a device. As a consequence, it is required to reduce the amount of current necessary to reverse the magnetization direction in a current-induced magneto-resistive device.

Furthermore, as the device becomes smaller in size, it becomes possible to switch a magnetization direction by thermal fluctuation, which may cause recorded information to be lost unexpectedly. To avoid this problem, magnetic anisotropy energy (KV, where K denotes an anisotropic energy density, V denotes a volume of a device) should be kept higher than thermal energy ($k_B T$, where $k_B$ denotes Boltzmann constant, and T denotes temperature).

SUMMARY OF THE INVENTION

Therefore, the present invention is contrived to overcome the related art problems, and several objects of the present invention are, 1) to provide a magnetic tunnel junction structure in which an increased reproduction signal value is provided and a critical current value required for magnetization switching is reduced, 2) to provide a magnetic tunnel junction structure by which a high spin polarization and a high magneto-resistance ratio can be obtained, 3) to provide a structure by which loss of recorded information due to thermal fluctuation can be avoided even if several tens of nano size devices are fabricated, and 4) to provide a magnetic tunnel junction structure in which material stability is enhanced in post-processes, such as annealing, and a memory operation thereof.

To achieve these and other advantages and in accordance with the purpose of the present invention, as embodied and broadly described herein, there is provided a magnetic tunnel junction structure, including a first magnetic layer having a fixed magnetization direction; a second magnetic layer having a reversible magnetization direction; a non-magnetic layer (tunnel barrier) formed between the first magnetic layer and the second magnetic layer; a third magnetic layer allowing the magnetization direction of the first magnetic layer to be aligned perpendicular with respect to a plane of the first magnetic layer by a magnetic coupling to the first magnetic layer, and having a perpendicular magnetic anisotropic energy thereof larger than an in-plane magnetic anisotropic energy thereof; a first crystal-structure separation layer formed between the first magnetic layer and the third magnetic layer for separating a crystallographic structure of the first magnetic layer from that of the third magnetic layer; a fourth magnetic layer allowing the magnetization direction of the second magnetic layer to be aligned perpendicular with respect to a plane of the second magnetic layer by a magnetic coupling to the second magnetic layer, and having a perpendicular magnetic anisotropic energy thereof larger than an in-plane magnetic anisotropic energy thereof; and a second crystal-structure separation layer formed between the second magnetic layer and the fourth magnetic layer for separating a crystallographic structure of the second magnetic layer from that of the fourth magnetic layer.

In accordance with the present invention, the following effects can be obtained.

First, the magnetic tunnel junction structure can be configured so as to allow a magnetic coupling between the third magnetic layer having a large perpendicular magnetic anisotropic energy and the first magnetic layer adjacent to the non-magnetic layer (tunnel barrier), thereby maintaining the magnetization direction of the first magnetic layer to be perpendicular to the plane of the first magnetic layer upon current not being supplied, by virtue of the magnetic coupling between the first and third magnetic layers, resulting in reduction of a critical current value required for magnetization switching and enhancement of thermal stability.

Second, the introduction of the crystal-structure separation layers can prevent the destroy of the crystallographic structure of the first and second magnetic layers, which exhibits the most superior characteristic (e.g., coherent tunneling) upon having a body centered cubic (BCC) structure, even if the third or fourth magnetic layer is formed by using a perpendicular magnetic anisotropic material with a face centered cubic (FCC), a hexagonal close-packed (HCP) structure or a face centered tetragonal (FCT), thereby obtaining a high magneto-resistive ratio and inducing a perpendicular magnetization direction.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
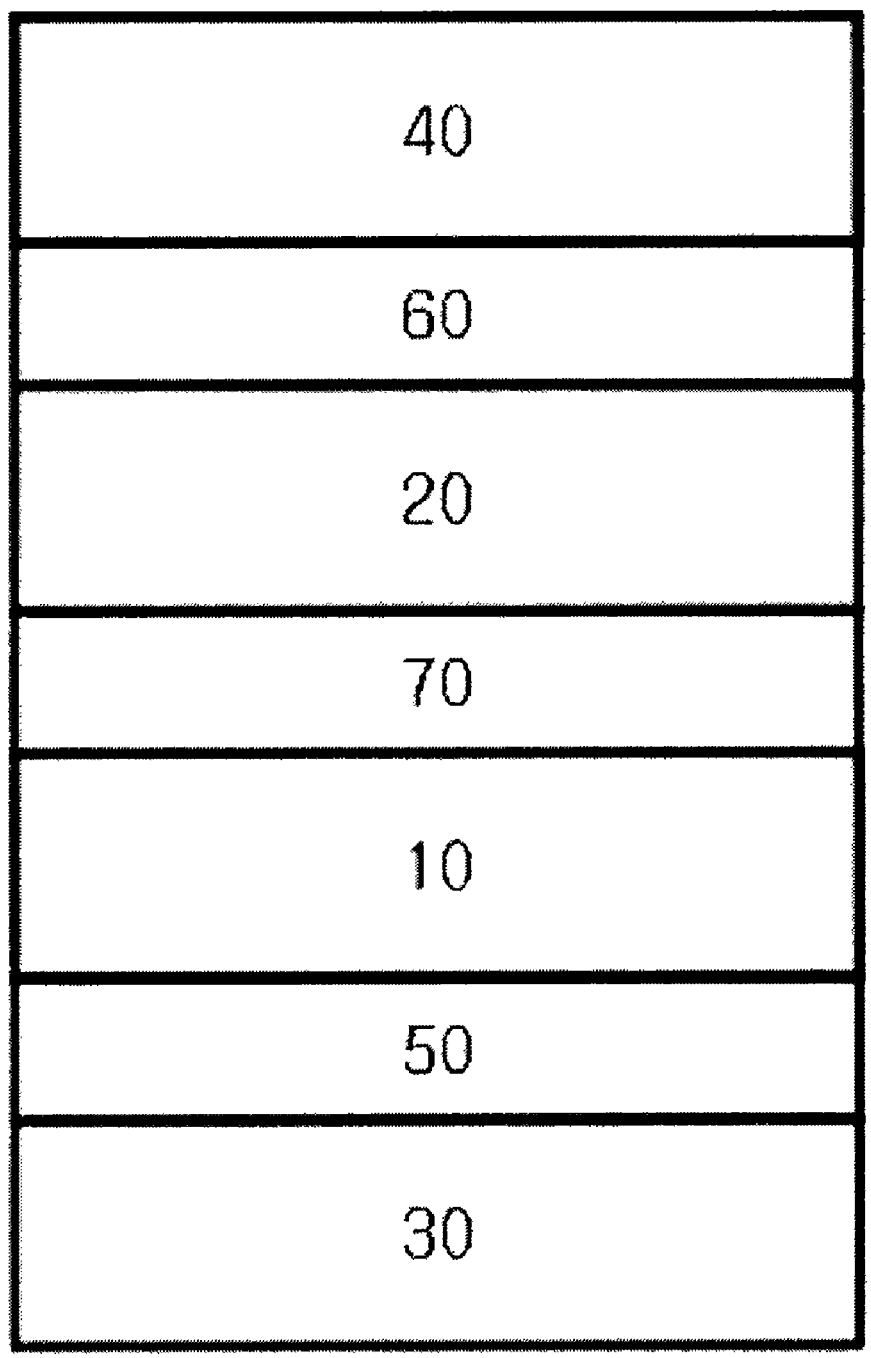
FIG. 1 is a schematic sectional view of a magnetic tunnel junction structure according to the present invention.

Description will now be given in detail of various configurations of a magnetic tunnel junction structure in accordance with the present invention, with reference to the accompanying drawings.

A magnetic tunnel junction structure according to the present invention may include a first magnetic layer having a fixed magnetization direction; a second magnetic layer having a reversible magnetization direction; a non-magnetic layer (tunnel barrier) formed between the first magnetic layer and the second magnetic layer; a third magnetic layer allowing the magnetization direction of the first magnetic layer to be aligned perpendicular with respect to a plane of the first magnetic layer by a magnetic coupling to the first magnetic layer, and having a perpendicular magnetic anisotropic energy thereof larger than an in-plane magnetic anisotropic energy thereof; a first crystal-structure separation layer formed between the first magnetic layer and the third magnetic layer for separating a crystallographic structure of the first magnetic layer from that of the third magnetic layer; a fourth magnetic layer allowing the magnetization direction of the second magnetic layer to be aligned perpendicular with respect to a plane of the second magnetic layer by a magnetic coupling to the second magnetic layer, and having a perpendicular magnetic anisotropic energy thereof larger than an in-plane magnetic anisotropic energy thereof; and a second crystal-structure separation layer formed between the second magnetic layer and the fourth magnetic layer for separating a crystallographic structure of the second magnetic layer from that of the fourth magnetic layer.

Here, the non-magnetic layer (tunnel barrier) may comprise an insulator or semiconductor, and the insulator may be at least one selected from a group consisting of $MgO$, $Al_2O_3$, $HfO_2$, $TiO_2$, $Y_2O_3$, and $Yb_2O_3$.

The first magnetic layer may have a layered (lamination) structure of a magnetic layer, a non-magnetic layer and a magnetic layer, and the first and second magnetic layers may include FeX, CoX, NiX, FeCoX, CoNiX or NiFeX (here, X may be at least one selected from a group consisting of B, Re, Rh, Cr, Cu, Gd and Tb).

Also, regarding a lattice structure, the first and second magnetic layers may have a body centered cubic (BCC) structure, respectively, and the third and fourth magnetic layers may have a face centered cubic (FCC), a face centered tetragonal (FCT) or a hexagonal close-packed (HCP) structure, respectively.

Also, each magnetization easy axis of the third and fourth magnetic layers may be oriented perpendicular to each plane of the first and second magnetic layers, and each magnetization direction of the third and fourth magnetic layers may be aligned with respect to each plane of the third and fourth magnetic layers at an angle in the range of $60° \leq \theta \leq 120°$.

Each of the third and fourth magnetic layers may be formed by using alloy with the FCT structure, such as at least one selected from a group consisting of FePt, CoPt, FePd and MnAl, or by using alloy with the HCP structure, such as $CO_3Pt$ alloy or CoCrPt alloy. Alternatively, each of the third and fourth magnetic layers may be formed by using a rare-earth transition metal alloy, such as $Fe_{14}Nd_2B$ or $SmCO_5$ or by using a multi-layer thin film, namely, $[Co/Pt]_n$, $[CoX\ alloy/Pt]_n$, $[Co/Pd]_n$, $[CoX\ alloy/Pd]_n$, $[Co/Ni]_n$, $[CoX\ alloy/Ni]_n$ or $[Ni/Pt]_n$ (here, n is a number between 1 and 10, and X denotes at least one selected from a group consisting of Fe, Ni, Cr, Ru, Re, Rh, Gd and Tb).

Meanwhile, the first and second crystal-structure separation layers may have an amorphous structure, be formed of a material by which the amorphous structure is maintained even when being thermally treated at 200~600° C., and be formed by using at least one selected from a group consisting of Ru, Ta, Re, Hf, W, Os, Ir and Rh.

The magnetic tunnel junction structure may further include an underlayer formed under the third magnetic layer, and comprising at least one selected from a is group consisting of Au, Cu, Pd, Pt, Ta and diamond-like carbon.

Hereinafter, exemplary embodiments according to the present invention will be described with reference to the accompanying drawings.

A magnetic tunnel junction structure according to each exemplary embodiment may include a first magnet layer 10, a second magnetic layer 20, a third magnetic layer 30, a fourth magnetic layer 40, a first crystal-structure separation layer 50, a second crystal-structure separation layer 60 and a non-magnetic layer (tunnel barrier) 70.

Here, the first magnet layer 10, the first crystal-structure separation layer 50 and the third magnetic layer 30 may be referred to as a fixed magnetic layer or fixed magnetization layer, and the second magnetic layer 20, the second crystal-structure separation layer 60 and the fourth magnetic layer 40 may be referred to as a free magnetic layer or free magnetization layer.

The configuration of the first magnetic layer may be described as follows.

The first magnetic layer 10 has a perpendicular magnetic anisotropy as a fixed magnetic layer in which the magnetization direction is fixed, and is separated from the second magnetic layer 20 by the non-magnetic layer (tunnel barrier) 70. The magnetization direction of each of the first and second magnetic layers 10 and 20 is substantially perpendicular to a plane of the first or second magnetic layer (i.e., a horizontal direction or a thin film plane of the first or second magnetic layer), due to a perpendicular magnetic anisotropy of the material or a perpendicular magnetic anisotropy induced by the third or fourth magnetic layer 30 or 40. The first and second magnetic layers 10 and 20 may include FeX, CoX, NiX, FeCoX, CoNiX or NiFeX (here, X may be at least one selected from a group consisting of B, Re, Rh, Cr, Cu, Gd and Tb).

The configuration of the non-magnetic layer (tunnel barrier) will be described as follows.

The non-magnetic layer (tunnel barrier) 70 is formed between the first and second magnetic layers 10 and 20 to serve as a tunnel barrier. The non-magnetic layer 70 may include an insulator or semiconductor, and MgO, $Al_2O_3$, $HfO_2$, $TiO_2$, $Y_2O_3$, and/or $Yb_2O_3$ may be used for the insulation substance. For instance, in case of using MgO as the non-magnetic layer 70, it is possible to obtain a high magneto-resistance ratio by coherent tunneling. The thickness of the non-magnetic layer 70 is preferably 0.7~2 nm. If it is thinner than 0.7 nm, TMR ratio can be decreased because the effect of spin filtering is reduced and a leakage current may likely occur due to generation of pin holes or the like. If it is thicker than 2 nm, it may cause a problem of increasing the drive voltage too much because the resistance-area (RA) product is increased.

The configuration of the fixed magnetic layer (fixed magnetization layer) will be described as follows.

The first magnetic layer 10 is a fixed magnetic layer in which the magnetization direction is fixed, and the magnetization direction is perpendicular to a plane of a thin film. If the third magnetic layer 30 is not present, the first magnetic layer 10 may be substantially parallel to a plane of the first magnetic layer due to a shape magnetic anisotropy (i.e., in-plane magnetic anisotropy) of the thin film. However, in accordance with the present invention, the magnetization direction of the first magnetic layer 10 is nearly at a right angle with the horizontal direction (i.e., a plane of the first magnet layer or a thin film plane) because a magnetic coupling is made between the first magnetic layer 10 and the third magnetic layer 30 having a large perpendicular magnetic anisotropy by interposing is the first crystal-structure separation layer 50 therebetween. The inclination angle θ with respect to the plane of the third magnet layer is preferably 60°≦θ≦120°. The first magnetic layer 10 may include FeX, CoX, NiX, FeCoX, CoNiX or NiFeX (here, X may be at least one selected from a group consisting of B, Re, Rh, Cr, Cu, Gd and Tb). The thickness of the first magnetic layer 10 is preferably 1~5 nm. An enough spin polarization cannot be obtained if the first magnetic layer 10 is too thin, and a magnetization switching by a current becomes difficult if it is too thick.

The first third magnetic layer 30 is formed adjacent to the first crystal-structure separation layer 50 to serve such that the magnetization direction of the first magnetic layer 10 is perpendicular to a plane of the first magnetic layer 10 due to the magnetic coupling to the first magnetic layer 10. The third magnetic layer 30 has a characteristic such that perpendicular magnetic anisotropic energy (i.e., magnetic anisotropic energy in the direction perpendicular to the plane of the third magnetic layer, $K_u$) is larger than the shape magnetic anisotropic energy (i.e., in-plane magnetic anisotropic energy, $2\pi M_s^2$) of the thin film. The perpendicular magnetic anisotropic energy of the third magnetic layer 30 is too large and thus the magnetization easy axis is preferably oriented in a direction perpendicular to the horizontal direction (i.e., a plane of the first magnetic layer or a plane of the third magnetic layer).

In order to allow the third magnetic layer 30 to have the perpendicular magnetic anisotropy, the third magnetic layer 30 may be formed by using a face centered tetragonal (FCT) alloy, such as FePt, CoPt, FePd or MnAl alloy, using Co3Pt alloy or CoCrPt alloy having HCP structure, or using a rare-earth transition metal alloy, such as $Fe_{14}Nd_2B$ or $SmCO_5$. Alternatively, the third magnetic layer 30 may be formed by using a multi-layer thin film, such as $[Co/Pt]_n$, $[CoX\ alloy/Pt]_n$, $[Co/Pd]_n$, $[CoX\ alloy/Pd]_n$, $[Co/Ni]_n$, $[CoX\ alloy/Ni]_n$ or $[Ni/Pt]_n$. Here, n is a number between 1 and 10, and X denotes at least one selected from a group consisting of Fe, Ni, Cr, Ru, Re, Rh, Gd and Tb. Also, perpendicular magnetic anisotropy energy indicating a strength of perpendicular magnetic anisotropy can be adjusted based upon the repetition number of the Co/(Pt, Pd, Ni) or CoX alloy/(Pt, Pd, Ni). The thickness of Co is preferably decreased to obtain a high perpendicular magnetic anisotropy, and a thick Co is preferably selected to obtain a low perpendicular magnetic anisotropy.

In the meantime, the first crystal-structure separation layer 50 may be formed between the first magnetic layer 10 and the third magnetic layer 30 to induce a magnetic coupling between the first and third magnetic layers 10 and 30 and separate a crystallographic structure between the first and third magnetic layers 10 and 30.

The magnetic coupling induced by the crystal-structure separation layer 50 may be made in the following two cases.

First, magnetic layers at both ends of the crystal-structure separation layer may induce the magnetic coupling by a direct exchange coupling because the crystal-structure separation layer is sufficiently thin.

Second, free electrons within the crystal-structure separation layer 50 exist like a sinusoidal wave that is confined in a quantum well, and those free electrons mediate an exchange interaction between both magnetic layers 10 and 30, thereby inducing a magnetic coupling by interposing the crystal-structure separation layer 50 therebetween.

Also, the reason why the separation of crystallographic structure between the first and third magnetic layers 10 and 30 is important as follows.

For example, the magnetic tunnel junction using MgO as a tunnel barrier shows a high magneto-resistance ratio, because the crystallographic orientation of MgO (002) matches with the crystallographic orientation of the first and second magnetic layers adjacent to that barrier and thus only the wave function having a specific symmetry (Δ1 symmetry) selectively penetrates the MgO barrier. Consequently, it is required for the magnetic layer to have a specific crystallographic orientation in order to obtain a high magneto-resistance ratio. The crystal structure of a magnetic material suitable for coherent tunneling in combination with the MgO thin film is a body centered cubic (BCC) structure. Typically, a method of obtaining a magnetic layer having a BCC crystal structure can be generally divided into two types. First, there is a method of epitaxially growing a magnetic layer having a BCC crystal structure using a method such as molecular beam epitaxy, or the like. Second, there is a method of forming a magnetic layer having an amorphous structure such as CoFeB at both ends of the MgO barrier, allowing the CoFeB layer to lose a boron (B) content thereof by annealing and to be transformed from an amorphous structure to a crystal structure, thereby forming a BCC structure that is epitaxial with a crystal structure of MgO.

On the other hand, a specific crystal structure is also required to have a high perpendicular magnetic anisotropy. Most perpendicular magnetic anisotropic materials are formed with a face centered cubic (FCC), a face centered tetragonal (FCT) or a hexagonal close-packed (HCP) structure. In case where a perpendicular magnetic anisotropic material adjoins a magnetic layer, a FCC or HCP crystal structure propagates into the magnetic layer during annealing, thereby destroying a BCC crystal structure originally possessed by the magnetic layer. In this case, the crystallographic orientation is not maintained in the structure of the first magnetic layer 10/the non-magnetic layer 70/the second magnetic layer 20, for example, CoFeB/MgO/CoFeB trilayer structure, resulting in impossibility of obtaining a high magneto-resistance ratio. However, the introduction of the crystal-structure separation layer can prevent the crystallographic orientation of the perpendicular anisotropic material from propagating into the first magnetic layer, resulting in maintaining the crystallographic orientation.

The crystal-structure separation layer 50 preferably has an amorphous structure. Specifically, it is preferably a material having a high melting point, and not being crystallized but maintaining an amorphous structure during a post-annealing process (e.g., at temperatures of 200-600° C.). For example, it may be possible to select at least one from a group consisting of Ru, Ta, Re, Hf, W, Os, Ir or Rh as the material of the crystal-structure separation layer 50.

Figure 2:
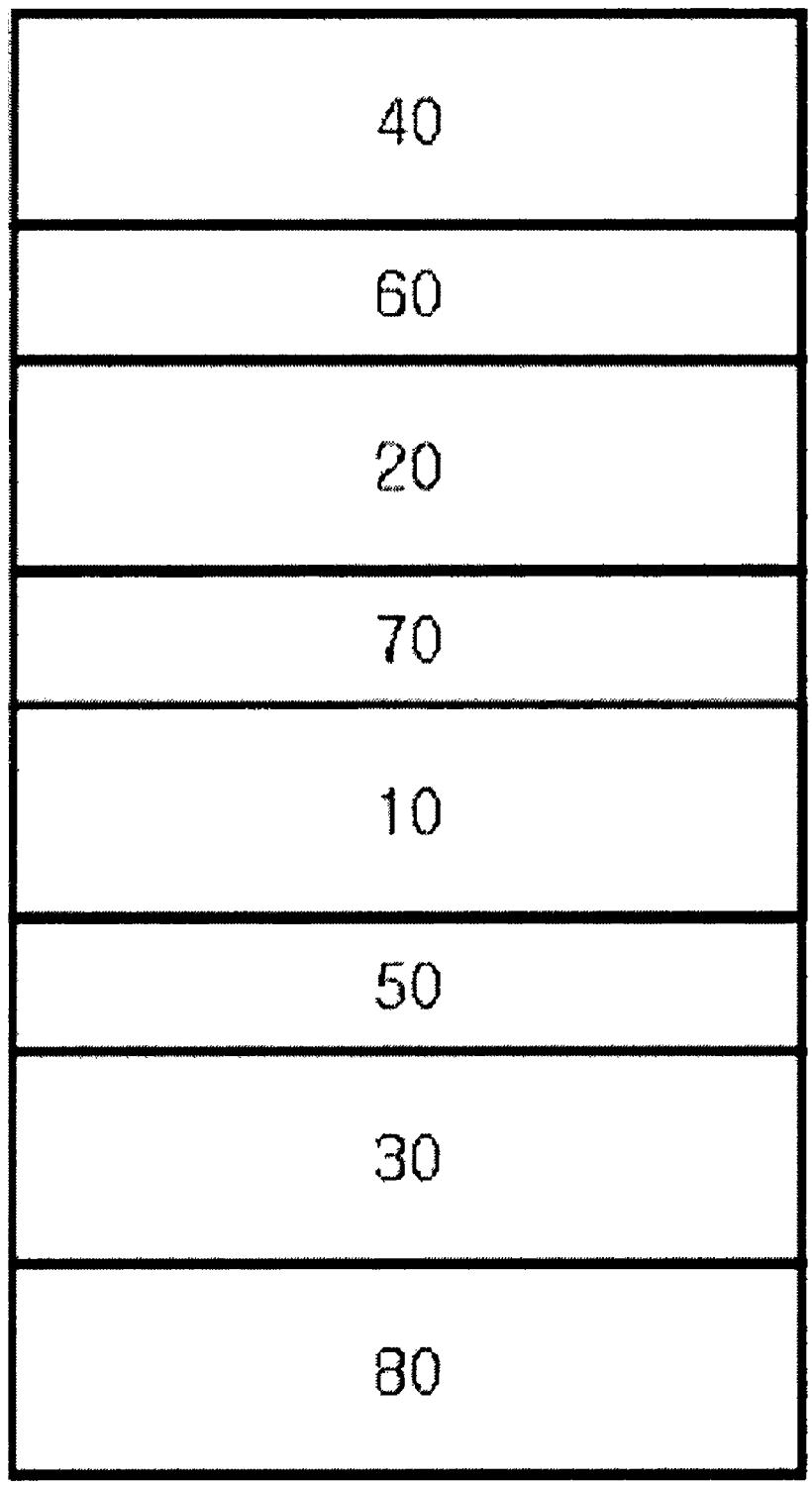
FIG. 2 is a schematic sectional view of the magnetic tunnel junction structure in case of further including an underlayer (buffer layer)

In some cases, in order to facilitate the magnetization perpendicular to the third magnetic layer 30, as shown in FIG. 2, an underlayer (buffer layer) 80 may further be formed under the third magnetic layer 30. The underlayer (buffer layer) 80 may include at least one selected from a group consisting of Au, Ru, Ta, Cu, CuN, Pd, Pt and diamond-like carbon.

The configuration of the free magnetic layer (free magnetization layer) will be described as follows.

The fourth magnetic layer 40 is formed adjacent to the second crystal-structure separation layer 60 to serve such that the magnetization direction of the second magnetic layer 20 is perpendicular to a plane of the second magnetic layer 20 due to the magnetic coupling to the second magnetic layer 20. The fourth magnetic layer 40 has a characteristic such that perpendicular magnetic anisotropic energy (i.e., magnetic anisotropic energy in the direction perpendicular to the plane of the fourth magnetic layer, $K_u$) is larger than the shape magnetic anisotropic energy (i.e., in-plane magnetic anisotropic energy, $2\pi M_s^2$) of the thin film. The perpendicular magnetic anisotropic energy of the fourth magnetic layer 40 is too large and thus the magnetization easy axis is preferably oriented in a direction perpendicular to the horizontal direction (i.e., a plane of the first magnetic layer or a plane of the third magnetic layer).

In order to allow the fourth magnetic layer 40 to have the perpendicular magnetic anisotropy, the fourth magnetic layer 40 may be formed by using a face centered tetragonal (FCT) alloy, such as FePt, CoPt, FePd or MnAl alloy, using $CO_3Pt$ alloy or CoCrPt alloy having HCP structure, or using a rare-earth transition metal alloy, such as $Fe_{14}Nd_2B$ or $SmCO_5$. Alternatively, the fourth magnetic layer 40 may be formed by using a multi-layer thin film, such as $[Co/Pt]_n$, $[CoX$ alloy/$Pt]_n$, $[Co/Pd]_n$, $[CoX$ alloy/$Pd]_n$, $[Co/Ni]_n$, $[CoX$ alloy/$Ni]_n$ or $[Ni/Pt]_n$. Here, n is a number between 1 and 10, and X denotes at least one selected from a group consisting of Fe, Ni, Cr, Ru, Re, Rh, Gd and Tb. Also, perpendicular magnetic anisotropy energy indicating a strength of perpendicular magnetic anisotropy can be adjusted based upon the repetition number of the Co/(Pt, Pd, Ni) or CoX alloy/(Pt, Pd, Ni). The thickness of Co is preferably decreased to obtain a high perpendicular magnetic anisotropy, and a thick Co is preferably selected to obtain a low perpendicular magnetic anisotropy.

In the meantime, the second crystal-structure separation layer 60 may be formed between the second magnetic layer 20 and the fourth magnetic layer 40 to induce a magnetic coupling between the second and fourth magnetic layers 20 and 40 and separate a crystallographic structure between the second and fourth magnetic layers 20 and 40.

The principle of inducing the magnetic coupling by the second crystal-structure separation layer 60 may be the same as the principle of inducing the magnetic coupling by the first crystal-structure separation layer 50.

Also, the reason why the separation of crystallographic structure between the second and fourth magnetic layers 20 and 40 may be the same as the importance of the separation of the crystallographic structure between the first and third magnetic layers 10 and 30.

Here, the coercivity of the free magnetic layer comprising the second magnetic layer 20, the fourth magnetic layer 40 and the second crystal-structure separation layer 60 may preferably be smaller than the coercivity of the fixed magnetic layer comprising the first magnetic layer 10, the third magnetic layer 30 and the first crystal-structure separation layer 50.

Figure 3:
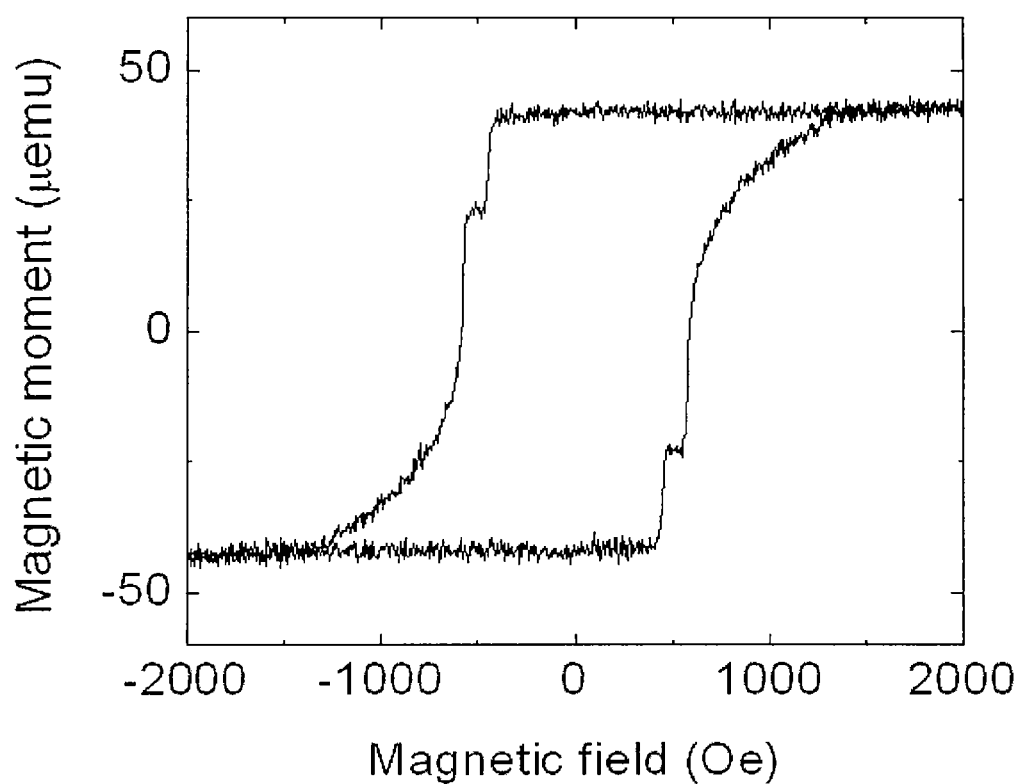
FIG. 3 is a graph showing a magnetization-magnetic field curve after performing a annealing at 270° C. with respect to the structure shown in FIG. 2 actually implemented using alloy and a multilayer thin film system.

An example in which the perpendicular magnetic anisotropy was actually implemented using the structure of FIG. 2 was shown in FIG. 3. FIG. 3 shows a magnetization-magnetic field curve (M-H hysteresis Loop) measured by applying the magnetic layer in a direction perpendicular to the plane of the thin film, by which it can be noticed that a residual magnetization value (i.e., a value of magnetization M in case of external magnetic field=0) is nearly the same as a saturation magnetization value, and thus the direction perpendicular to the plane of the thin film is a magnetic easy axis. It can also be seen that the magnetic moment of the free magnetic layer comprising the second magnetic layer 20, the fourth magnetic layer 40 and the second crystal-structure separation layer 60 is reversed at a position where the external magnetic field is 450 Oe and the magnetic moment of the fixed magnetic layer comprising the first magnetic layer 10, the third magnetic layer 30 and the first crystal-structure separation layer 50 is reversed at a position where the external magnetic field is 570 Oe. Consequently, it can be understood that the thin film structure shown in FIG. 3 should satisfy the characteristic that the coercivity of the free magnetic layer must be smaller than that of the fixed magnetic layer.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A magnetic tunnel junction structure comprising a first magnetic layer having a fixed magnetization direction;
a second magnetic layer having a reversible magnetization direction;
a non-magnetic layer tunnel barrier formed between the first magnetic layer and the second magnetic layer;
a third magnetic layer allowing the magnetization direction of the first magnetic layer to be aligned perpendicular with respect to a plane of the first magnetic layer by a magnetic coupling to the first magnetic layer, and having a perpendicular magnetic anisotropic energy thereof larger than an in-plane magnetic anisotropic energy thereof;
a first crystal-structure separation layer formed between the first magnetic layer and the third magnetic layer for separating a crystallographic structure of the first magnetic layer from that of the third magnetic layer;
a fourth magnetic layer allowing the magnetization direction of the second magnetic layer to be aligned perpendicular with respect to a plane of the second magnetic layer by a magnetic coupling to the second magnetic layer, and having a perpendicular magnetic anisotropic energy thereof larger than an in-plane magnetic anisotropic energy thereof; and
a second crystal-structure separation layer formed between the second magnetic layer and the fourth magnetic layer for separating a crystallographic structure of the second magnetic layer from that of the fourth magnetic layer,
wherein at least one of the first and second magnetic layers has a body centered cubic structure, and at least one of the third and fourth magnetic layers has a face centered cubic structure, a face centered tetragonal structure or a hexagonal close-packed structure,
wherein each magnetization easy axis of the third and fourth magnetic layers is oriented perpendicular to each plane of the first and second magnetic layers.

2. The structure of claim 1, wherein the non-magnetic layer comprises an insulator or semiconductor, wherein the insulator is at least one selected from a group consisting of MgO, $Al_2O_3$, $HfO_2$, $TiO_2$, $Y_2O_3$, and $Yb_2O_3$.

3. The structure of claim 1, wherein the first magnetic layer has a layered structure of a magnetic layer, a non-magnetic layer and a magnetic layer.

4. The structure of claim 1, wherein at least one of the first and second magnetic layers is formed by using FeX, CoX, NiX, FeCoX, CoNiX or NiFeX, where X is at least one selected from a group consisting of B, Re, Rh, Cr, Cu, Gd and Tb.

5. The structure of claim 1, wherein each magnetization direction of the third and fourth magnetic layers is aligned with respect to each plane of the third and fourth magnetic layers at an angle in the range of $60° \leq \theta \leq 120°$.

6. The structure of claim 1, wherein at least one of the third and fourth magnetic layers is formed by using alloy with a face centered tetragonal structure.

7. The structure of claim 6, wherein the alloy with the face centered structure comprises at least one selected from a group consisting of FePt, CoPt, FePd and MnAl.

8. The structure of claim 1, wherein at least one of the third and fourth magnetic layers is formed by using alloy with a hexagonal close-packed (HCP) structure.

9. The structure of claim 8, wherein the alloy with the hexagonal close packed (HCP) structure comprises $Co_3Pt$ alloy or CoCrPt alloy.

10. The structure of claim 1, wherein at least one of the third and fourth magnetic layers is formed by using a rare-earth transition metal alloy.

11. The structure of claim 10, wherein the rare-earth transition metal alloy comprises $Fe_{14}Nd_2B$ or $SmCo_5$.

12. The structure of claim 1, wherein at least one of the third and fourth magnetic layers is formed by using a multi-layer thin film.

13. The structure of claim 12, wherein the multi-layer thin film comprises $[Co/Pt]_n$, $[CoX\ alloy/Pt]_n$, $[Co/Pd]_n$, $[CoX\ alloy/Pd]_n$, $[Co/Ni]_n$, $[CoX\ alloy/Ni]_n$, or $[Ni/Pt]_n$, where n is a number between 1 and 10, and X denotes at least one selected from a group consisting of Fe, Ni, Cr, Ru, Re, Rh, Gd and Tb.

14. The structure of claim 1, wherein at least one of the first and second crystal-structure separation layers has an amorphous structure.

15. The structure of claim 1, wherein at least one of the first and second crystal-structure separation layers is formed by using a material by which the amorphous structure is maintained even when being thermally treated at 200~600° C.

16. The structure of claim 1, wherein at least one of the first and second crystal-structure separation layers is formed by using at least one independently selected from a group consisting of Ru, Ta, Re, Hf, W, Os, Ir and Rh.

17. The structure of claim 1, further comprising an underlayer formed under the third magnetic layer.

18. The structure of claim 17, wherein the underlayer is formed by using at least one selected from a group consisting of Au, Cu, Pd, Pt, Ta and diamond-like carbon.

* * * * *